United States Patent [19]
Bentley et al.

[11] Patent Number: 5,315,284
[45] Date of Patent: May 24, 1994

[54] ASYNCHRONOUS DIGITAL THRESHOLD DETECTOR FOR A DIGITAL DATA STORAGE CHANNEL

[75] Inventors: Steven R. Bentley; Robert A. Hutchins, both of Tucson, Ariz.; Constantin M. Melas, Los Gatos; Pantas Sutardja, San Jose, both of Calif.

[73] Assignee: International Business Machines Corporation, Armonk, N.Y.

[21] Appl. No.: 73,921

[22] Filed: Jun. 7, 1993

Related U.S. Application Data

[63] Continuation of Ser. No. 995,849, Dec. 23, 1992, abandoned.

[51] Int. Cl.$^5$ .................. G05B 1/03; G06F 7/02; H03K 5/153
[52] U.S. Cl. .................. 340/146.2; 307/354; 328/151
[58] Field of Search .............. 340/146.2; 307/354, 307/351; 328/151

[56] References Cited

U.S. PATENT DOCUMENTS

| | | | |
|---|---|---|---|
| 3,593,166 | 7/1971 | Martin | 328/150 |
| 3,840,753 | 10/1974 | Kuo | 307/354 |
| 3,916,328 | 10/1975 | Wilson | 328/150 |
| 3,955,102 | 5/1976 | Chi | 307/235 |
| 4,132,909 | 1/1979 | Nutz | 307/354 |
| 4,151,427 | 4/1979 | Travin | 307/252 |
| 4,165,491 | 8/1979 | Geffon | 328/150 |
| 4,268,764 | 5/1981 | Eckert | 307/354 |
| 4,352,999 | 10/1982 | Galpin | 307/354 |
| 4,412,339 | 10/1983 | Alfke et al. | 375/95 |
| 4,480,200 | 10/1984 | Tan et al. | 307/354 |
| 4,749,879 | 6/1988 | Peterson et al. | 307/354 |
| 4,795,915 | 1/1989 | Sun et al. | 307/234 |
| 5,001,364 | 3/1991 | Petrie et al. | 307/354 |
| 5,181,226 | 1/1993 | Cantwell | 307/354 |
| 5,182,476 | 1/1993 | Hanna et al. | 307/354 |

*Primary Examiner*—John Zazworsky
*Attorney, Agent, or Firm*—Baker, Maxham Jester & Meador

[57] ABSTRACT

A zero-crossing detector for asynchronous detection of threshold transitions in a digitally sampled signal waveform. The Asynchronous Digital Threshold Detector (ADTD) receives a digitized self-clocking data readback waveform and provides the relative location of a zero-crossing within the sample period where it occurs. The digital output, which is useful for recovering data and clock signals, is in a digital form that can be used directly by a certain class of asynchronous digital phase detector systems. The ADTD is entirely digital and can be embodied in a low power configuration using CMOS technology.

35 Claims, 6 Drawing Sheets

ASYNCHRONOUS DIGITAL THRESHOLD DETECTOR FOR A DIGITAL DATA STORAGE CHANNEL

CROSS-REFERENCES TO RELATED APPLICATIONS

This application is filed under 37 C.F.R. Sections 1.53 and 1.78(a) as a continuation of patent application Ser. No. 07/995,849, which was filed on Dec. 23, 1992, and is hereafter abandoned.

BACKGROUND OF THE INVENTION

1. Field of the invention

This invention relates to zero-crossing threshold detectors in general and, more specifically, to a digital zero-crossing detector for providing a digital output signal representing the detection location within an asynchronous sampling window.

2. Description of the Related Art

In the data storage arts, binary data is encoded and stored on optical or magnetic media as a series of optical or magnetic transitions. Retrieval of stored data requires a detecting and decoding system in the recording channel to reconstruct the original binary data and synchronous clock from the self-clocking analog signal waveform created by the magnetic or optical transducer adjacent to the storage medium. Practitioners in the art have proposed many solutions to the problems associated with extracting synchronous clock and data from a self-clocking data signal. These problems include discrimination between actual transitions and mere noise pulses and precise reconstruction of the synchronous data clock signal to permit accurate decoding of the phase-encoded data. An important element in such recording channels is the waveform transition or "zero-crossing" detector, which is necessary to accurately determine the precise relative timing or phase of each self-clocking waveform transition.

Analog pulse detectors known in the art suffer from the usual disadvantages of analog electronic apparatus. They are expensive, bulky and subject to calibration drift over time. Moreover, analog pulse detectors are generally suited to a narrow predetermined range of channel data rates, imposing severe channel data rate restrictions on storage media data retrieval systems. Digital implementations of data pulse or transition phase detectors known in the art usually rely on discrete-signal embodiments of the well-known analog detection techniques. For instance, the analog signal waveform is first sampled and digitized using well-known Phase-Locked Loop (PLL) techniques. These samples are then processed digitally to remove unwanted frequency components and to reconstruct the synchronous clock and data. There is a clearly felt need in the art for a fully digital implementation of a channel waveform transition phase detector that can accurately detect self-clocking data pulses in a recording channel data signal waveform over a wide range of data rates. The crucial need is for accurate synchronous data detection at moderate asynchronous sampling rates because high-speed sampling techniques are disadvantageously expensive.

Digital computer programs are known in the art for simulating the functions of analog recording channels but these techniques require high sampling rates, making implementation in real-time hardware expensive and difficult. Some of the difficulty involved in digital implementation can be overcome by reducing the asynchronous analog signal sampling rate. Unfortunately, a reduced asynchronous sampling rate results in increased uncertainty of the zero-crossing detection time. This leads to jitter distortion and increased Bit Error Rate (BER) in the recording channel.

Practitioners in the art have made efforts to reduce jitter at lower sampling rates by improving inter-sample interpolation. For instance, in U.S. Pat. No. 4,412,339, Peter H. Alfke et al disclose a zero-crossing interpolator intended to reduce isochronous distortion in a digital FSK modem. Alfke et al teach improving the precision of zero-crossing detection by adding a high-speed internal clock to step the detector along a linear slope between each input sample pair until a change in sign is detected. Thus, their technique requires the same high speed digital devices that make higher sampling rate disadvantageous. Moreover, although Alfke et al teach the use of digital devices, the output of their zero-crossing interpolator is a simple analog timing gate that is subject to the same sources of analog errors affecting analog zero-crossing detector embodiments.

In U.S. Pat. No. 4,165,491, Arthur P. Geffon discloses a circuit for detecting zero-crossing points in a data signal in the presence of noise. Geffon teaches a pulse-qualification technique for eliminating zero-crossings that presumably arise from noise. He neither considers nor suggests methods for detecting zero-crossings in a digitally sampled signal.

In U.S. Pat. No. 4,749,879, Donald S. Peterson et al disclose a signal transition detection method for finding signal waveform transitions in a binary-encoded analog signal waveform. Peterson et al teach the use of a second differentiation step to provide a second derivative signal that improves the noise immunity of their analog circuit. They neither consider nor suggest means for detecting threshold transitions in a digitally-sampled signal waveform. Other similar disclosures of improved analog detectors may be found in U.S. Pat. Nos. 3,593,166; 3,916,328; 3,955,102; 4,132,909; 4,151,427; 4,268,764; 4,480,200; 4,795,915; and 5,001,364. There is still a clearly felt need in the art for a digital zero-crossing detector that incorporates digital interpolation techniques to provide accurate transition timing outputs at relatively low asynchronous sampling rates. This requirement is especially important in modern digital recording channels that must be entirely implemented on low-power single-chip digital integrated circuits without analog components. The related unresolved problems and deficiencies are clearly felt in the art and are solved by this invention in the manner described below.

SUMMARY OF THE INVENTION

This invention is a zero-crossing threshold detector designed for use in an asynchronous digital channel. It receives a digitized signal waveform in which self-clocking data is encoded and outputs the relative location of a zero-crossing within the sample period, if any. This digital output, which is intended for use in recovering the embedded data and clock signals, is in a digital form that can be used directly by the Discrete Time Control Loop (DTCL) disclosed in a copending patent application by R. A. Hutchins et al entitled "Discrete Time Control Loop Method And Apparatus For Clocking Data In An Asynchronous Channel", filed on Oct. 28, 1992, as patent application Ser. No. 07/967,588, which is included herein in its entirety by this reference.

The Asynchronous Digital Threshold Detector (ADTD) of this invention employs the following three steps to estimate the zero-crossing arrival time within a single sampling interval. First, the detector determines if a zero-crossing has occurred by examining adjacent sample pairs for changes in sign. Secondly, the sample rate is converted from the higher sampling rate to a lower sampling rate, which is exactly half of the higher rate. In doing this, the ADTD first determines which half of the new longer sample period contains the zero-crossing. Finally, the ADTD determines the subcell time estimate; that is, the proportional location $\hat{t}$ of the zero-crossing within the shorter sampling period by solving a linear interpolation formula (FIG. 1B). The detector output is an n-bit digital signal representing the estimated fraction of time elapsed within the longer sampling interval at the zero-crossing point ($t/T_d$ in FIG. 1A).

It is an object of this invention to improve zero-crossing accuracy at lower asynchronous sampling rates. It is another object of this invention that threshold crossings are detected in a stream of digital samples without recourse to analog components.

It is a feature and advantage of this invention that the zero-crossing detections are presented in the form of an n-bit digital word, the accuracy of which is independent of analog signal timing considerations.

The foregoing, together with other objects, features and advantages of this invention, will become more apparent when referring to the following specification, claims and the accompanying drawing.

BRIEF DESCRIPTION OF THE DRAWING

For a more complete understanding of this invention, reference is now made to the following detailed description of the preferred embodiment as illustrated in the accompanying drawing, wherein.

DESCRIPTION OF THE PREFERRED EMBODIMENT

Figure 1A:
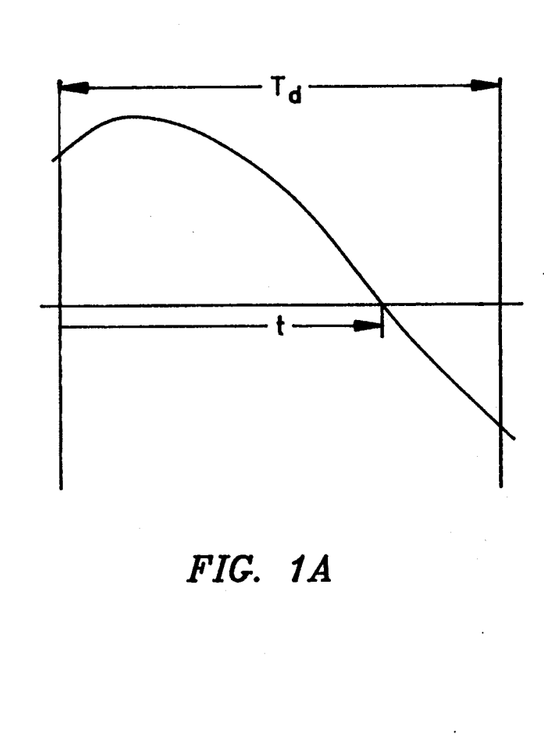
FIGS. 1A-1B show a signal waveform zero-crossings in a sampling interval.
Figure 1B:
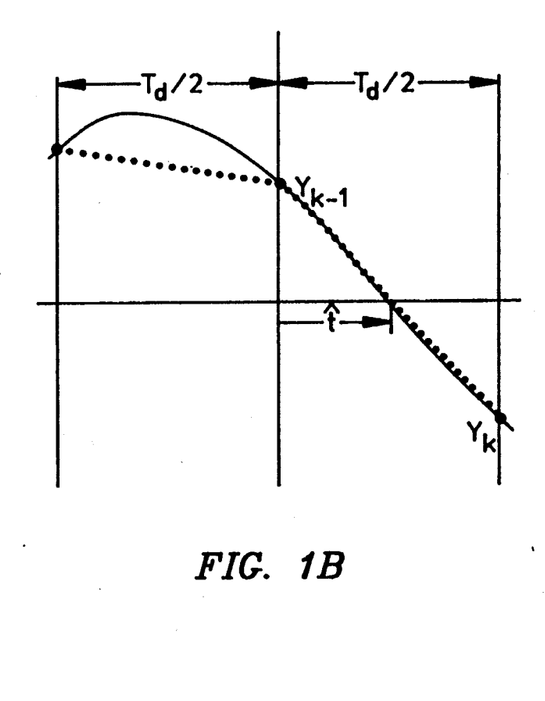

FIGS. 1A-1B show the relationship between the sampling interval $T_s = T_d/2$ in FIG. 1B and the self-clocking data interval $T_d$ in FIG. 1A. The ADTD of this invention determines the subcell time estimate t (FIG. 1B) and converts it to a digital representation of the ratio $t/T_d$ (FIG. 1A).

Figure 2:
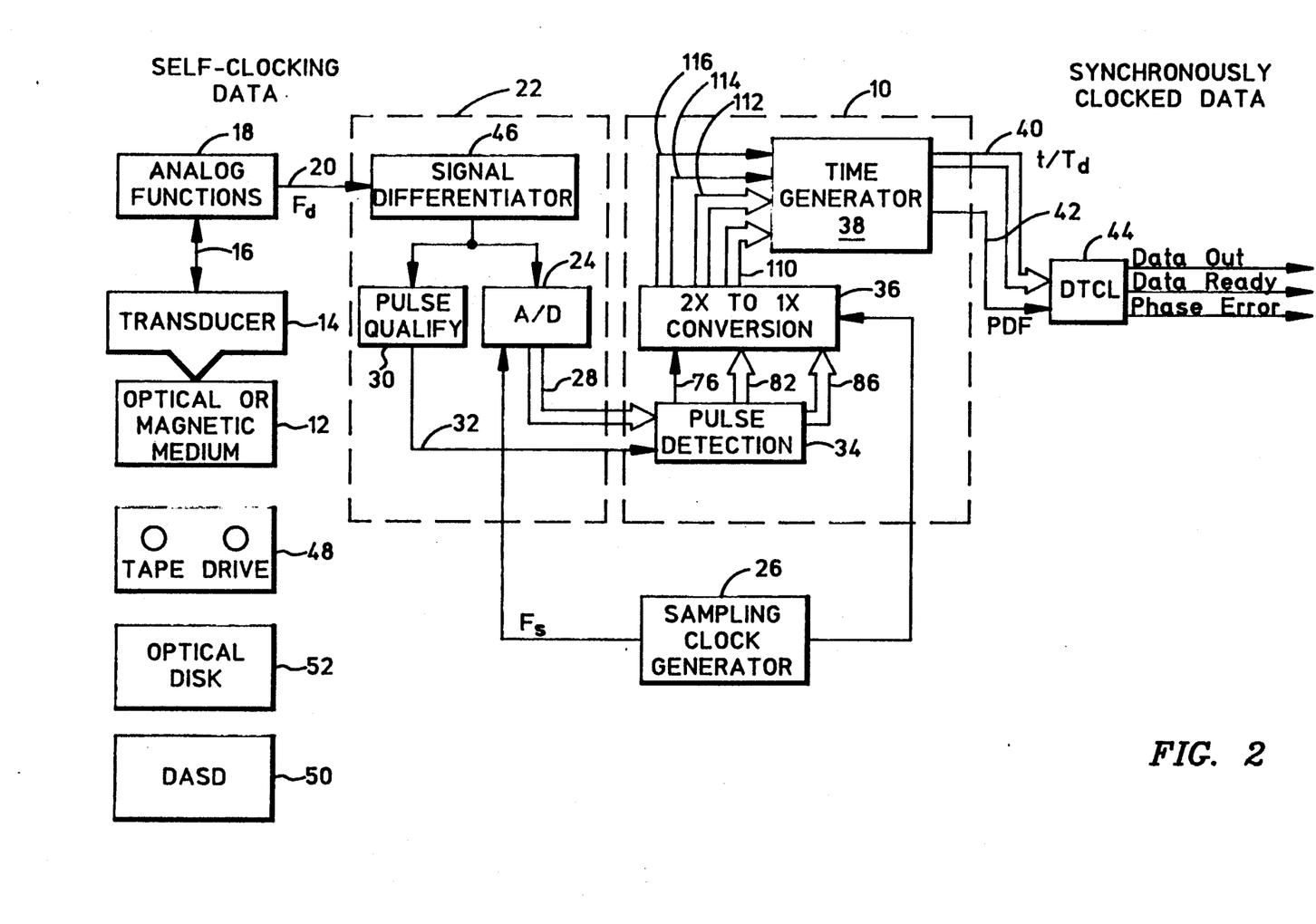
FIG. 2 provides a block diagram showing the relationship between the ADTD of this invention to the other elements in a recording channel.

FIG. 2 illustrates the relationship between the ADTD 10 of this invention and the optical or magnetic data storage medium 12. A peak detection channel implement action is shown for illustrative purposes. Magnetic or optical transitions in medium 12 are sensed by a transducer 14 in any useful manner known in the art. The transducer output signal 16 is presented to the usual plurality of analog functions 18. These functions include preamplification, Automatic Gain Control (AGC), and anti-aliasing (low-pass) filtering. The resulting analog data signal waveform 20 is presented to a waveform preprocessor 22 for signal differentiation, pulse qualification and Analog-to-Digital (A/D) conversion in any useful manner known in the art. The A/D sampling rate in A/D converter 24 is controlled by a sampling clock generator 26, which generates a sampling clock signal $F_s = 2F_d$ at twice the self-clocking data rate of signal waveform 20. The digital sample signals {S} are forwarded on a sample bus 28 to ADTD 10. The pulse qualifier 30 generates a pulse qualification flag that is forwarded on a line 32 to ADTD 10. The pulse qualification flag discriminates between signal pulses and noise pulses in any useful manner known in the art and is asserted during every sample interval $T_s$ containing a qualified pulse or transition.

The ADTD embodiment 10 in FIG. 2 embraces a pulse detector 34, a 2x-to-1x converter 36 and a time generator 38. Converter 36 operates at two clock rates: a sampling rate F, from generator 26 and a data clock rate $F_d = F_2/2$. ADTD 10 provides two digital outputs. A digital signal representing the relative position of a threshold transition within a data clock interval ($t/T_d$) is provided on a data bus 40 and a Pulse Detection Flag (PDF) is forwarded on a line 42. Line 42 is high during the entire data clock interval $T_d$ that contains a qualified threshold transition detection.

FIG. 2 shows bus 40 and line 42 feeding into a Discrete Time Control Loop (DTCL) 44 for subsequent read-back channel processing in accordance with the above-cited Hutchins et al patent application. Any other suitable methods may also be employed to extract data and synchronous clock signals from ADTD 10 digital outputs on bus 40 and line 42, such as digital-to-analog conversion followed by phase-locked loop signal processing.

In waveform preprocessor 22, a signal differentiator 46 differentiates data signal waveform 20 to convert waveform peaks to zero-crossing transitions in any useful manner known to the art. In situations where medium 12 consists of the magnetic tape in a tape drive 48 or the magnetic disk surface in a Direct Access Storage Device (DASD) 50, the data recovered appear in waveform 20 as peaks or pulses. Detection of such pulses requires differentiation in signal differentiator 46. However, where the medium is an optical medium such as in an optical disk 52, the signal may be Pulse-Width-Modulated (PWM) so that the recovered data are encoded as waveform transitions through a variable but predetermined threshold. For such applications, signal differentiator 46 is unnecessary and should be replaced by some suitable form of threshold-following signal processing known in the art. In either event, pulse detector 34 must actually detect signal waveform transitions through zero. In operation, pulse detector 34 can be better understood with reference to FIG. 3.

Figure 3:
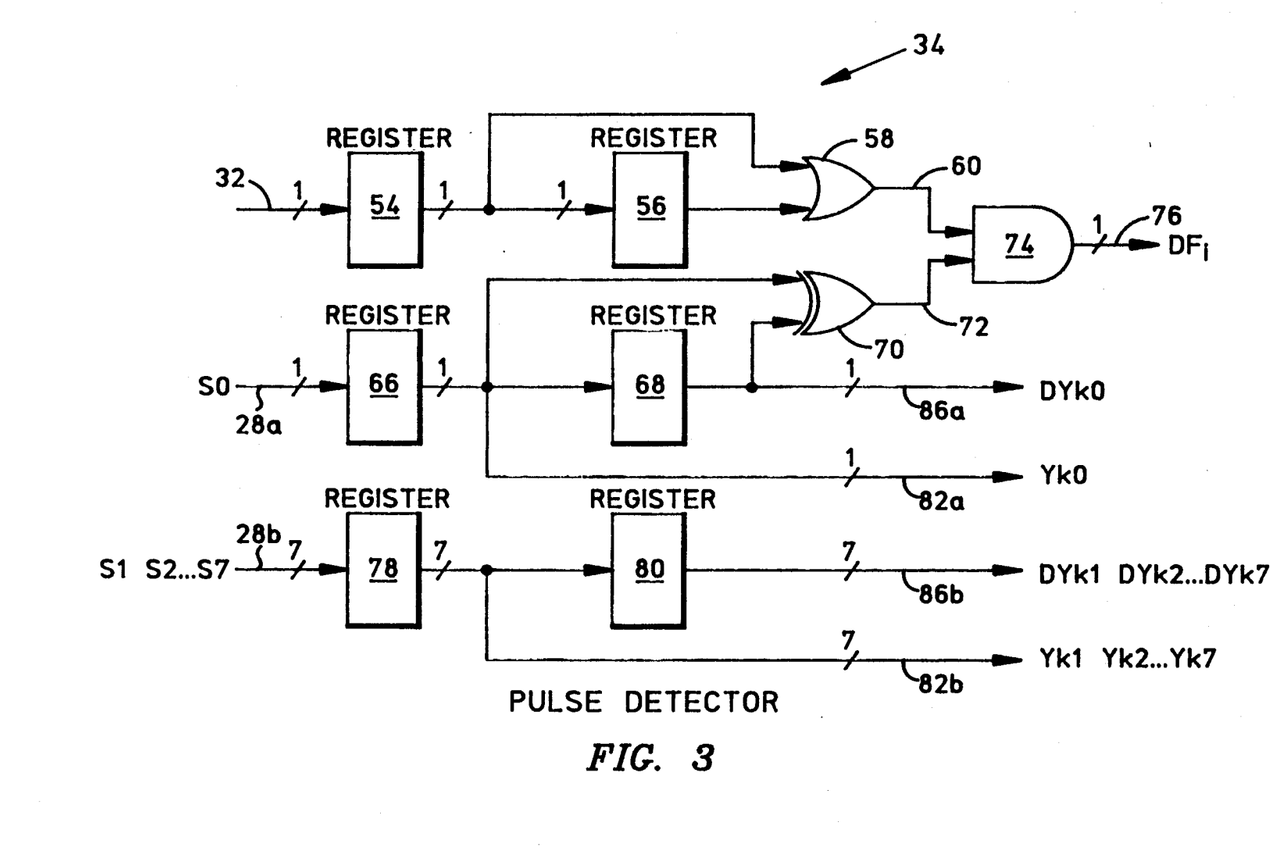
FIG. 3 provides a block diagram of the preferred embodiment of the pulse detector element of the ADTD of this invention.

In FIG. 3, the pulse qualification flag on line 32 is stored in register 54. A register 56 stores a once-delayed value for the pulse qualification flag and an OR-gate 58 provides an enabling qualification flag on line 60 that is asserted if there is a qualified detection in either the present $(i)^{th}$ or the immediately preceding $(i-1)^{th}$ sampling interval $T_s$.

The digital signal on bus 28 is split into the sign bit at a line 28a and the remaining 7-bit mantissa on a bus 28b. The registers 66 and 68 store the sign of the present sample $S_i$ and the sign of the immediately preceding sample $S_{i-1}$ for comparison. An XOR-gate 70 provide a detection flag on line 72 that is high whenever there is a change in sign between $S_{i-1}$ and $S_i$. An AND-gate 74 combines the enabling qualification flag on line 60 and the transition detection flag on line 72 to provide a detection flag $DF_i$ at an output line 76.

The 7-bit registers 78 and 80 serve to assemble pairs of digital signals $(y_{k-1}, y_k)$ that represent adjacent sample pairs $(S_{i-1}, S_i)$. Thus, the present digital signal $y_k$ is passed through on the bus 82 (with its sign carried on line 82a) and the once-delayed digital signal $y_{k-1}$ is passed through on the bus 86 (with its sign on line 86a). Buses 82 and 86 and flag line 76 carry the adjacent digital signal pair and the associated detection flag to converter 36 (FIG. 4).

Figure 4:
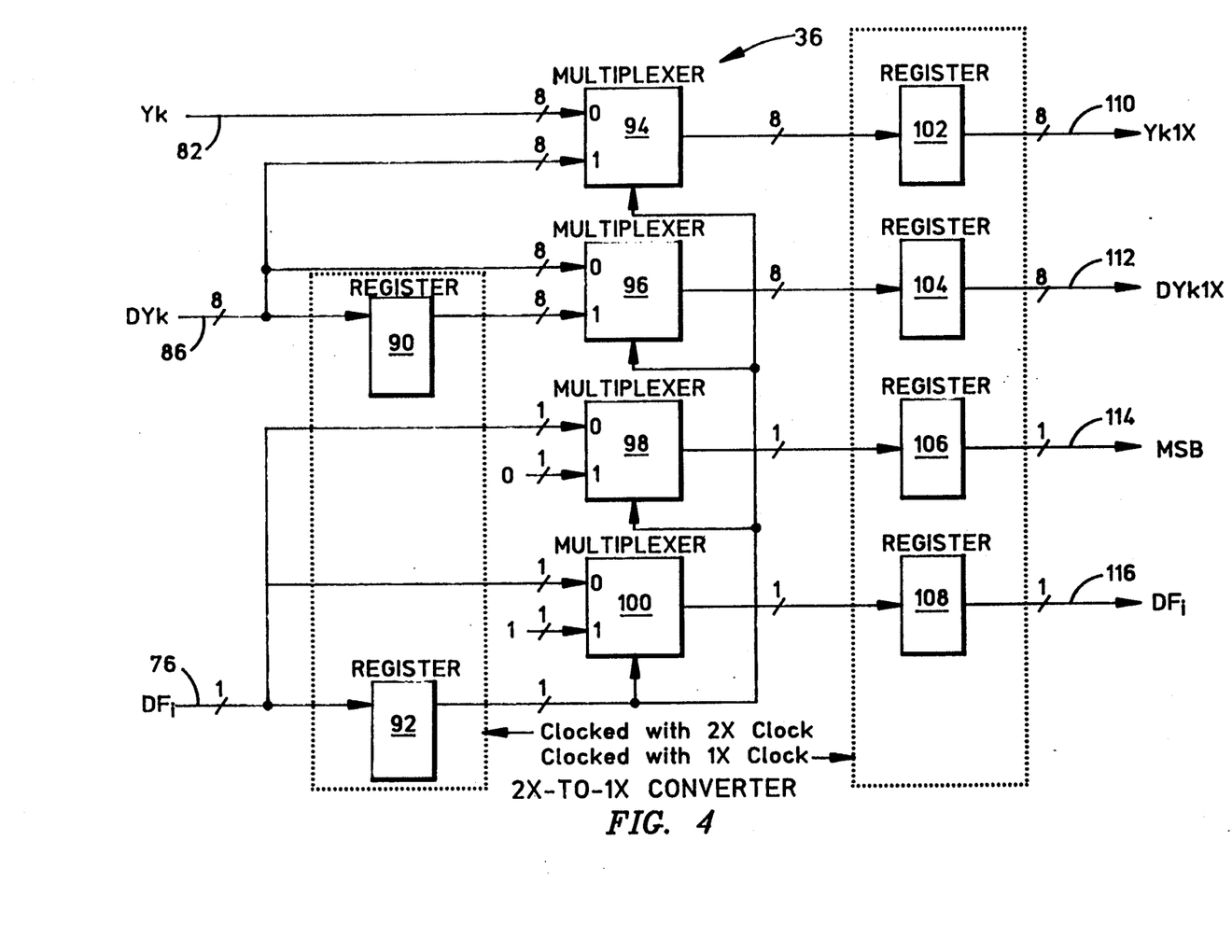
FIG. 4 provides a block diagram of the preferred embodiment of the 2X-to-1X converter element of the ADTD of this invention.

Converter 36 can be better understood with reference to FIG. 4. Converter 36 acts as a "decimator", which replaces a digital signal pair with a single digital signal. The input registers 90 and 92 are clocked at the sample clock rate $F_s$. Register 90 stores the delayed signal value $y_{k-1}$. Register 92 stores the $DF_i$ detection flag, which flags a detection within the present $T_s$ interval. The present signal $y_k$ on bus 82 is presented directly to the first input of a multiplexer 94. Delayed signal $y_{k-1}$ is presented to the second input of multiplexer 94 and to the first input of another multiplexer 96. The second input of multiplexer 96 is provided with $y_{k-2}$, which is merely $y_{k-1}$ delayed by one additional sampling clock interval $T_s$. Finally, the two multiplexers 98 and 100 are provided with detection flag $DF_i$ at their first inputs and a fixed binary "0" or "1" at their second inputs as shown in FIG. 4. Accordingly, as detection flag $DF_i$ is clocked through register 92 by the sampling clock $F_s$, the inputs to multiplexers 94–100 are passed through to registers 102, 104, 106 and 108. Registers 102–108 are clocked at half the rate of registers 90–92. Thus, it can be appreciated that converter 36 selects the adjacent digital signals and the detection flag in the subcell where the zero-crossing occurs (it is assumed that a maximum of one zero-crossing can occur per nominal sample period).

Converter 36 sets the MSB of the zero-crossing time estimate according to the half of the nominal sample period $T_d 2T_s$ in which the zero-crossing occurs. Converter 36 also holds the present digital signal $y_k$ on bus 110 and the once-delayed digital signal $y_{k-1}$ on bus 112 to represent a qualified adjacent sample pair $(S_{i-1}, S_i)$. This pair is held for two $T_s$ sample intervals and is forwarded to time generator 38 for additional processing. The MSB on line 114 is also held for $T_3 = 2T_s$ and passed forward to time generator 38 to serve as the Most Significant Bit (MSB) for the final transition time ratio as discussed below. Finally, the detection flag $DF_i$ on line 116 is the half-rate equivalent of $DF_i$ on line 76. That is, line 116 is asserted if a qualified threshold transition detection exists anywhere within the two adjacent sample intervals $2T_s = T_d$.

Figure 5:
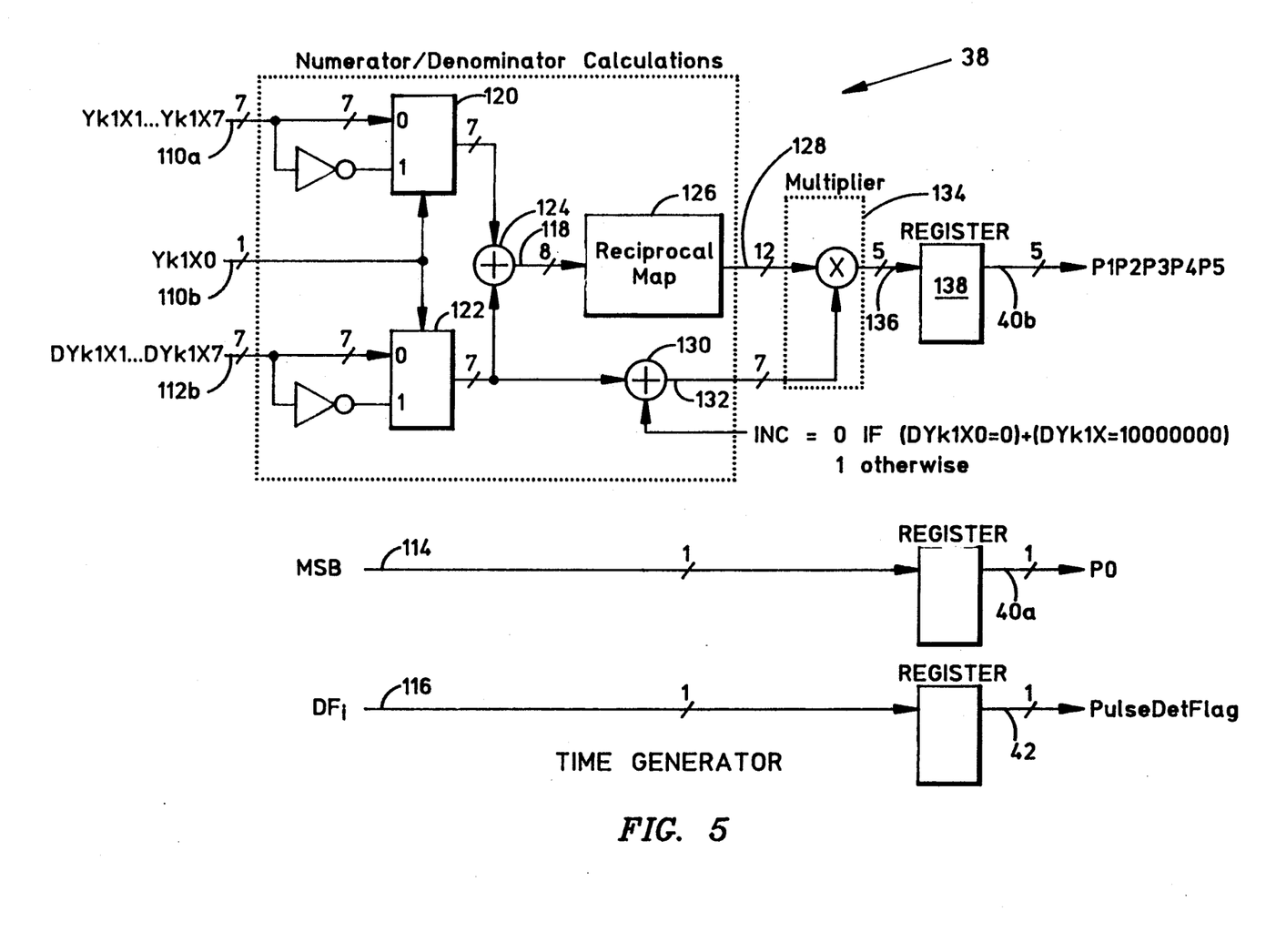
FIG. 5 provides a block diagram of the preferred embodiment of the time generator element of the ADTD of this invention.

FIG. 5 shows a detailed embodiment of time generator 38. The purpose of generator 38 is to estimate the zero-crossing arrival time by solving an interpolation equation relating the transition detection to the digital signals $(y_{k-1}, y_k)$ representing adjacent sample pair $(S_{i-1}, S_i)$ preserved in registers 102 and 104 (FIG. 4). This pair is input to generator 38 on the buses 110 and 112. The 8-bit digital signal on bus 110 is split, with the MSB on line 110b and the remaining 7-bit mantissa on bus 110a in FIG. 5. Similarly, the seven LSBs are provided at bus 112b in FIG. 5. The MSB from bus 112 (FIG. 4) is unnecessary, being implied by the combination of $DF_i$ on line 116 and the sign bit at line 110b.

Generator 38 solves any useful interpolation formula relating the detection to the sample pair $(S_{i-1}, S_i)$. The inventors prefer a simple linear interpolation equation:

$$t/T_d = -\frac{-y_{k-1}}{y_k - y_{k-1}}$$

where $y_k$ is the intermediate digital signal equivalent to sample $S_i$. For a valid zero-crossing, the sign of $y_k$ is the opposite of $y_{k-1}$, permitting the above equation to be rewritten as $$t/T_d = \frac{y_{k-1}}{y_k - y_{k-1}}.$$

This simplifies the evaluation of the earlier interpolation equation by eliminating the sign bit.

In FIG. 5, the denominator $|y_k - y_{k-1}|$ is first determined at the denominator signal bus 118. This is accomplished by the multiplexers 120 and 122 and the summer 124 as follows. Multiplexer 120 selects the absolute value of the present signal $y_k$ and multiplexer 122 selects the absolute value of the delayed signal $y_{k-1}$ when $y_k$ has a positive sign at line 110b. If the sign of $y_k$ is negative, the 2s-compliment of each of these two digital signals are selected. Summer 124 adds the two selected 7-bit digital signals to provide the denominator signal $|y_k - y_{k-1}|$ on bus 118.

Denominator signal 118 is then inverted by any useful means, such as by a reciprocal map 126. Map 126 operates in any useful manner known in the art, such as a 256-Byte lookup table, and provides a 12-bit output reciprocal signal on a bus 128. A summer multiplexer 122, depending on the sign bit of the delayed signal $y_{k-1}$, and produces the absolute value of $|y_{k-1}|$ on bus 132. A multiplier 134 multiplies the 12-bit reciprocal output signal on bus 128 with the 7-bit numerator on bus 132 and strips the 14 LSBs from the result, leaving a 5-bit zero-crossing signal on bus 136. This signal is then stored for one sample interval in register 138 to provide the additional delay necessary to synchronize operation with the remainder of generator 38. Ultimately, the output zero-crossing estimate signal $t/T_d$ is provided on bus 40, with the MSB at line 40a signifying which of two adjacent sampling periods $T_s$ contains the event.

The inventors have simulated the preferred embodiment disclosed in FIGS. 2–5, using an 8-bit input sample on bus 28, a tracking threshold bit that indicates whether the given sample is over a qualification threshold on line 32 and outputting a 6-bit time estimate on bus 40 with a valid sample flag (PDF) on line 42. As implemented in CMOS II technology, ADTD 10 requires approximately 1500 gates. The preferred embodiment has also been implemented in a magnetic tape data storage system.

The inventors have also simulated this implementation in APL to determine how closely actual ADTD 10 performance matches a simple theoretical linear interpolation formula. All possible adjacent digital pair signal combinations were provided to an APL bit-for-bit circuit simulation. The output of the simulated ADTD 10 was then compared with the theoretical solution to the linear interpolation formula (FIG. 5) and the results plotted in FIGS. 6A–6B.

Figure 6A:
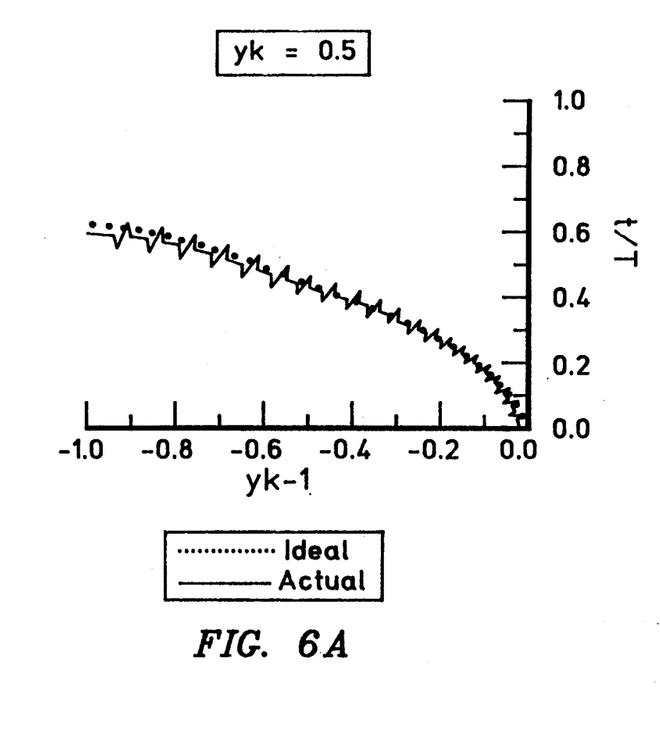
FIGS. 6A-6B provide examples of the performance of the ADTD of this invention.
Figure 6B:
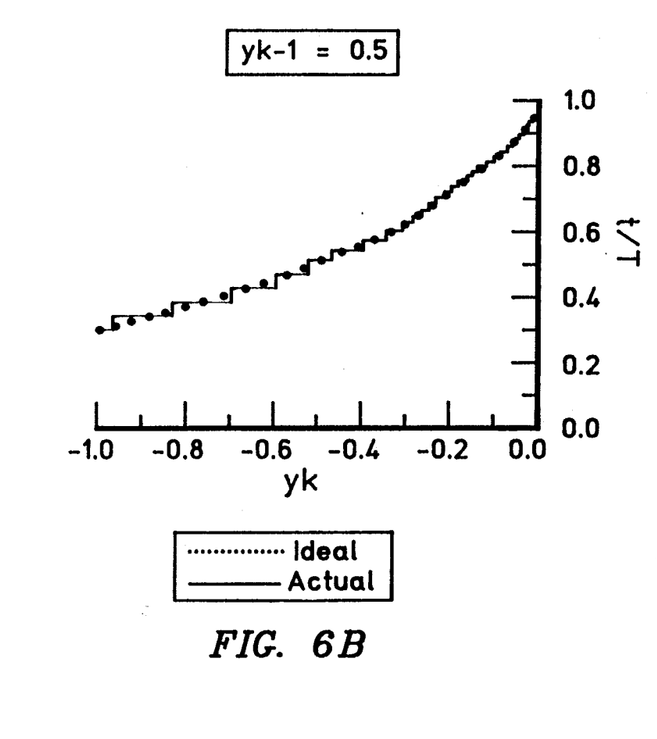

In FIG. 6A, $y_k$ was fixed at 0.5 and $y_{k-1}$ was varied across the full range of possible values (all ranges were normalized to unity). The simulated results are very closely aligned with the theoretical results. In FIG. 6B, $y_{k-1}$ was fixed at 0.5 and $y_k$ was varied across the full range of possible values. Again, the simulated ADTD 10 performance closely matches the expected output across the full range of possible inputs. The differences between the two curves in each of FIGS. 6A and 6B result from quantization error.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawing.

We claim:

1. A method for asynchronous detection of the time t of a threshold transition in a signal waveform having a data clock rate $F_d$, said method comprising the steps of:

(a) sampling said signal waveform at a first clock rate $R_s = 2F_d$ equal to the reciprocal of a first sampling interval $T_s$ to create a plurality of digital sample signals $\{S\}$ representing a series of instantaneous values of said signal waveform including an $i^{th}$ sample signal $S_i$ and the preceding adjacent sample signal $S_{i-1}$ where i is a nonzero positive integer;

(b) creating a detection signal responsive to a signal difference between said sample signal $S_i$ and said sample signal $S_{i-1}$;

(c) doubling said first sampling interval $T_s$ to create a second sampling interval $T_d = 2T_s$ equal to the reciprocal of said data clock rate $F_d$;

(d) creating a first digital signal corresponding to that half of said second sampling interval $T_d$ in which said detection signal is located;

(e) creating a second digital signal by interpolating between said sample signal $S_i$ and said sample signal $S_{i-1}$, wherein said second digital signal represents an estimate of the location $t/T_s$ of said threshold transition within an $i^{th}$ said first sampling interval $T_s$; and (f) combining said first and second digital signals to create a third digital signal representing the location $t/T_d$ of said threshold transition within a contemporaneous said second sampling interval $T_d$.

2. The method of claim 1 wherein:
said first digital signal is the Most Significant Bit (MSB) of said third digital signal.

3. The method of claim 1 wherein said creating step (e) comprises the steps of:

(e.1) subtracting said sample signal $S_i$ from said sample signal $S_{i-1}$ to create a denominator signal $D_i = S_{i-1} - S_i$;

(e.2) creating a reciprocal difference signal $R_i = 1D_i$ representative of the reciprocal of said denominator signal $D_i$;

(e.3) multiplying said sample signal $S_{i-1}$ and said reciprocal differences signal $R_i$ to obtain an interpolation signal $R_i S_{i-1}$; and (e.4) creating said second digital signal $|R_i S_{i-1}|$ by discarding the signal from said interpolation signal $R_i S_{i-1}$, thereby estimating said threshold transition location $t/T_d = |R_i S_{i-1}|$.

4. An Asynchronous Digital Threshold Detector (ADTD) for detecting the time t of a threshold transition in a signal waveform having a data clock rate $F_d$, said ADTD comprising:

input means for accepting a plurality of digital sample signals $\{S\}$ at a transfer rate $F_s = 2F_d$ representing a sequence of instantaneous values of said signal waveform;

transition detection means coupled to said input means for assembling an adjacent pair of said digital sample signals $(S_i, S_{i-1})$ and creating a detection flag $DF_i$ responsive to a sign difference between said adjacent pair of digital sample signals $(S_i, S_{i-1})$;

decimation means coupled to said transition detection means for reducing said transfer rate $F_s$ of said sample signals from $2F_d$ to said data clock rate $F_d$; and time generator means coupled to said decimation means for interpolating said threshold transition time t within an interval $T_d$ equal to the reciprocal of said data clock rate $F_d$ and for creating a digital signal representative of the ratio $t/T_d$ of said transition time t to said interval $T_d$.

5. The ADTD of claim 4 wherein said input means further comprises:

means for accepting a pulse qualification flag representing that said threshold transition results from a signal pulse rather than a noise pulse.

6. The ADTD of claim 5 wherein said transition detection means comprises:

first register means for storing the earlier said digital sample signal $S_{i-1}$ of said adjacent pair of digital sample signals $(S_i, S_{i-1})$;

second register means for storing the later said digital sample signal $S_i$ of said adjacent pair of digital sample signals $(S_i, S_{i-1})$;

sign comparator means for creating a signal corresponding to the logical exclusive-or of the signs of said adjacent pair of digital sample signals $(S_i, S_{i-1})$; and detection qualification means for enabling the output from said sign comparator means responsive to both said pulse qualification flags corresponding to said adjacent pair of digital sample signals $(S_i, S_{i-1})$.

7. The ADTD of claim 6 wherein said decimation means comprises:

third register means for storing said adjacent pair of digital sample signals $(S_i, S_{i-1})$;

selection means for selecting within one said interval $T_d$ either a first said adjacent pair of digital sample signals $(S_i, S_{i-1})$ or a second said adjacent pair of digital sample signals $(S_{i+1}, S_i)$;

MSB means for identifying which of said first or second adjacent pairs of digital sample signals $(S_i, S_{i-1})$ is selected by said selection means; and dual clocking means for stepping the input of said decimation means at said transfer rate $F_s 2F_d$ and for stepping the output of said decimation means at said data rate $F_d$.

8. The ADTD of claim 7 wherein said time generator means comprises:

reciprocal map means for creating a reciprocal digital signal $|S_{i-1} S_i|^{-1}$ representing the reciprocal of the absolute value of the difference between said adjacent pair of digital sample signals $(S_i, S_{i-1})$; and multiplier means for multiplying said reciprocal digital signal $|S_{i-1}-S_i|^{-1}$ by the absolute value of said earlier digital sample signal $|S_{i-1}|$ to obtain said digital signal representing the ratio $t/T_d=|S_{i-1}|\cdot|S_{i-1}-S_i|^{-1}$ of said threshold transition time t to said interval $T_d$.

9. The ADTD of claim 4 wherein said transition detection means comprises:

first register means for storing the earlier said digital sample signal $S_{i-1}$ of said adjacent pair of digital sample signals $(S_i, S_{i-1})$;

second register means for storing the later said digital sample signal $S_i$ of said adjacent pair of digital sample signals $(S_i, S_{i-1})$;

sign comparator means for creating a signal corresponding to the logical exclusive-or of the signs of said adjacent pair of digital sample signals $(S_i, S_{i-1})$; and detection qualification means for enabling the output from said sign comparator means responsive to both said pulse qualification flags corresponding to said adjacent pair of digital sample signals $(S_i, S_{i-1})$.

10. The ADTD of claim 4 wherein said decimation means comprises:

third register means for storing said adjacent pair of digital sample signals $(S_i, S_{i-1})$;

selection means for selecting within one said interval $T_d$ either a first said adjacent pair of digital sample signals $(S_i, S_{i-1})$ or a second said adjacent pair of digital sample signals $(S_{1+1}, S_i)$;

MSB means for identifying which of said first or second adjacent pairs of digital sample signals $(S_i, S_{i-1})$ is selected by said selection means; and dual clocking means for stepping the input of said decimation means at said transfer rate $F_s 2F_d$ and for stepping the output of said decimation means at said data rate $F_d$.

11. The ADTD of claim 4 wherein said time generator means comprises:

reciprocal map means for creating a reciprocal digital signal $|S_{i-1}S_i|^{-1}$ representing the reciprocal of the absolute value of the difference between said adjacent pair of digital sample signals $(S_i, S_{i-1})$; and multiplier means for multiplying said reciprocal digital signal $|S_{i-1}-S_i|^{-1}$ by the absolute value of said earlier digital sample signal $|S_{i-1}|$ to obtain said digital signal representing the ratio $t/T_d=|S_{i-1}|\cdot|S_{i-1}-S_i|^{-1}$ of said threshold transition time t to said interval $T_d$.

12. In a Direct Access Storage Device (DASD) magnetic recording channel wherein digital data stored as a series of signal transitions in said DASD are read by sensing said transitions to create a signal waveform having a data clock rate $F_d$ equal to the reciprocal of a data clock interval $T_d$ and having transitions through a first threshold, said data being recovered in said channel, an Asynchronous Digital Threshold Detector (ADTD) comprising:

input means for accepting a plurality of digital sample signals $\{S\}$ at a transfer rate $F_s=2F_d$ representing a sequence of instantaneous values of said signal waveform;

transition detection means coupled to said input means for assembling an adjacent pair of said digital sample signals $(S_i, S_{i-1})$ and creating a detection flag $DF_i$ responsive to a sign difference between said adjacent pair of digital sample signals $(S_i, S_{i-1})$;

decimation means coupled to said transition detection means for reducing said transfer rate $F_s$ of said digital sample signals from $2F_d$ to said data clock rate $F_d$; and time generator means coupled to said decimation means for interpolating said threshold transition time t within an interval $T_d$ equal to the reciprocal of said data clock rate $F_d$ and for creating a digital signal representative of the ratio $t/T_d$ of said threshold transition time t to said interval $T_d$.

13. The ADTD of claim 12 wherein said input means further comprises:

means for accepting a pulse qualification flag representing that said threshold transition results from a signal pulse rather than a noise pulse.

14. The ADTD of claim 13 wherein said transition detection means comprises:

first register means for storing the earlier said digital sample signal $S_{i-1}$ of said adjacent pair of digital sample signals $(S_i, S_{i-1})$;

second register means for storing the later said digital sample signal $S_i$ of said adjacent pair of digital sample signals $(S_i, S_{i-1})$;

sign comparator means for creating a signal corresponding to the logical exclusive-or of the signs of said adjacent pair of digital sample signals $(S_i, S_{i-1})$; and detection qualification means for enabling the output from said sign comparator means responsive to both said pulse qualification flags corresponding to said adjacent pair of digital sample signals $(S_i, S_{i-1})$.

15. The ADTD of claim 14 wherein said decimation means comprises:

third register means for storing said adjacent pair of digital sample signals $(S_i, S_{i-1})$;

selection means for selecting within one said interval $T_d$ either a first said adjacent pair of digital sample signals $(S_i, S_{i-1})$ or a second said adjacent pair of digital sample signals $(S_{1+1}, S_i)$;

MSB means for identifying which of said first or second adjacent pairs of digital sample signals $(S_i, S_{i-1})$ is selected by said selection means; and dual clocking means for stepping the input of said decimation means at said transfer rate $F_s 2F_d$ and for stepping the output of said decimation means at said data rate $F_d$.

16. The ADTD of claim 15 wherein said time generator means comprises:

reciprocal map means for creating a reciprocal digital signal $|S_{i-1}S_i|^{-1}$ representing the reciprocal of the absolute value of the difference between said adjacent pair of digital sample signals $(S_i, S_{i-1})$; and multiplier means for multiplying said reciprocal digital signal $|S_{i-1}-S_i|^{-1}$ by the absolute value of said earlier digital sample signal $|S_{i-1}|$ to obtain said digital signal representing the ratio $t/T_d=|S_{i-1}|\cdot|S_{i-1}-S_i|^{-1}$ of said threshold transition time t to said interval $T_d$.

17. The ADTD of claim 12 wherein said transition detection means comprises:

first register means for storing the earlier said digital sample signal $S_{i-1}$ of said adjacent pair of digital sample signals $(S_i, S_{i-1})$;

second register means for storing the later said digital sample signal $S_i$ of said adjacent pair of digital sample signals ($S_i$, $S_{i-1}$);

sign comparator means for creating a signal corresponding to the logical exclusive-or of the signs of said adjacent pair of digital sample signals ($S_i$, $S_{i-1}$); and detection qualification means for enabling the output from said sign comparator means responsive to both said pulse qualification flags corresponding to said adjacent pair of digital sample signals ($S_i$, $S_{i-1}$).

18. The ADTD of claim 12 wherein said decimation means comprises:

third register means for storing said adjacent pair of digital sample signals ($S_i$, $S_{i-1}$);

selection means for selecting within one said interval $T_d$ either a first said adjacent pair of digital sample signals ($S_i$, $S_{i-1}$) or a second said adjacent pair of digital sample signals ($S_{1+1}$, $S_i$);

MSB means for identifying which of said first or second adjacent pairs of digital sample signals ($S_i$, $S_{i-1}$) is selected by said selection means; and dual clocking means for stepping the input of said decimation means at said transfer rate $F_s 2F_d$ and for stepping the output of said decimation means at said data rate $F_d$.

19. The ADTD of claim 12 wherein said time generator means comprises:

reciprocal map means for creating a reciprocal digital signal $|S_{i-1}S_i|^{-1}$ representing the reciprocal of the absolute value of the difference between said adjacent pair of digital sample signals ($S_i$, $S_{i-1}$); and multiplier means for multiplying said reciprocal digital signal $|S_{i-1}-S_i|^{-1}$ by the absolute value of said earlier digital sample signal $|S_{i-1}|$ to obtain said digital signal representing the ratio $t/T_d=|S_{i-1}|\cdot|S_{i-1}-S_i|^{-1}$ of said threshold transition time t to said interval $T_d$.

20. In an optical Pulse Width Modulated (PWM) storage device recording channel wherein digital data stored as a series of signal transitions in said optical medium are read by sensing said transitions to create a signal waveform having a data clock rate $F_d$ equal to the reciprocal of a data clock interval $T_d$ and having transitions through a first threshold, said data being recovered in said channel, an Asynchronous Digital Threshold Detector (ADTD) comprising:

input means for accepting a plurality of digital sample signals {S} at a transfer rate $F_2=2F_d$ representing a sequence of instantaneous values of said signal waveform;

transition detection means coupled to said input means for assembling an adjacent pair of said digital sample signals ($S_i$, $S_{i-1}$) and creating a detection flag $DF_i$ responsive to a sign difference between said adjacent pair of digital sample signals ($S_i$, $S_{i-1}$);

decimation means coupled to said transition detection means for reducing said transfer rate $F_s$ of said digital sample signals from $2F_d$ to said data clock rate $F_d$; and time generator means coupled to said decimation means for interpolating said threshold transition time t within an interval $T_d$ equal to the reciprocal of said data clock rate $F_d$ and for creating a digital signal representative of the ratio $t/T_d$ of said threshold transition time t to said interval $T_d$.

21. The ADTD of claim 20 wherein said input means further comprises:

means for accepting a pulse qualification flag representing that said threshold transition results from a signal pulse rather than a noise pulse.

22. The ADTD of claim 21 wherein said transition detection means comprises:

first register means for storing the earlier said digital sample signal $S_{i-1}$ of said adjacent pair of digital sample signals ($S_i$, $S_{i-1}$);

second register means for storing the later said digital sample signal $S_i$ of said adjacent pair of digital sample signals ($S_i$, $S_{i-1}$);

sign comparator means for creating a signal corresponding to the logical exclusive-or of the signs of said adjacent pair of digital sample signals ($S_i$, $S_{i-1}$); and detection qualification means for enabling the output from said sign comparator means responsive to both said pulse qualification flags corresponding to said adjacent pair of digital sample signals ($S_i$, $S_{i-1}$).

23. The ADTD of claim 22 wherein said decimation means comprises:

third register means for storing said adjacent pair of digital sample signals ($S_i$, $S_{i-1}$);

selection means for selecting within one said interval $T_d$ either a first said adjacent pair of digital sample signals ($S_i$, $S_{i-1}$) or a second said adjacent pair of digital sample signals ($S_{1+1}$, $S_i$);

MSB means for identifying which of said first or second adjacent pairs of digital sample signals ($S_i$, $S_{i-1}$) is selected by said selection means; and dual clocking means for stepping the input of said decimation means at said transfer rate $F_s 2F_d$ and for stepping the output of said decimation means at said data rate $F_d$.

24. The ADTD of claim 23 wherein said time generator means comprises:

reciprocal map means for creating a reciprocal digital signal $|S_{i-1}S_i|^{-1}$ representing the reciprocal of the absolute value of the difference between said adjacent pair of digital sample signals ($S_i$, $S_{i-1}$); and multiplier means for multiplying said reciprocal digital signal $|S_{i-1}-S_i|^{-1}$ by the absolute value of said earlier digital sample signal $|S_{i-1}|$ to obtain said digital signal representing the ratio $t/T_d=|S_{i-1}|\cdot|S_{i-1}-S_i|^{-1}$ of said threshold transition time t to said interval $T_d$.

25. The ADTD of claim 20 wherein said transition detection means comprises:

first register means for storing the earlier said digital sample signal $S_{i-1}$ of said adjacent pair of digital sample signals ($S_i$, $S_{i-1}$);

second register means for storing the later said digital sample signal $S_i$ of said adjacent pair of digital sample signals ($S_i$, $S_{i-1}$);

sign comparator means for creating a signal corresponding to the logical exclusive-or of the signs of said adjacent pair of digital sample signals ($S_i$, $S_{i-1}$); and detection qualification means for enabling the output from said sign comparator means responsive to both said pulse qualification flags corresponding to said adjacent pair of digital sample signals ($S_i$, $S_{i-1}$).

26. The ADTD of claim 20 wherein said decimation means comprises:
   third register means for storing said adjacent pair of digital sample signals ($S_i$, $S_{i-1}$);
   selection means for selecting within one said interval $T_d$ either a first said adjacent pair of digital sample signals ($S_i$, $S_{i-1}$) or a second said adjacent pair of digital sample signals ($S_{1+1}$, $S_i$);
   MSB means for identifying which of said first or second adjacent pairs of digital sample signals ($S_i$, $S_{i-1}$) is selected by said selection means; and
   dual clocking means for stepping the input of said decimation means at said transfer rate $F_s 2F_d$ and for stepping the output of said decimation means at said data rate $F_d$.

27. The ADTD of claim 20 wherein said time generator means comprises:
   reciprocal map means for creating a reciprocal digital signal $|S_{i-1}S_i|^{-1}$ representing the reciprocal of the absolute value of the difference between said adjacent pair of digital sample signals ($S_i$, $S_{i-1}$); and
   multiplier means for multiplying said reciprocal digital signal $|S_{i-1}-S_i|^{-1}$ by the absolute value of said earlier digital sample signal $|S_{i-1}|$ to obtain said digital signal representing the ratio $t/T_d = |S_{i-1}| \cdot |S_{i-1}-S_i|^{-1}$ of said threshold transition time t to said interval $T_d$.

28. In a data storage tape drive magnetic recording channel wherein digital data stored as a series of signal transitions in said magnetic tape are read by sensing said transitions to create a signal waveform having a data clock rate $F_d$ equal to the reciprocal of a data clock interval $T_d$ and having transitions through a first threshold, said data being recovered in said channel, an Asynchronous Digital Threshold Detector (ADTD) comprising:
   input means for accepting a plurality of digital sample signals {S} at a transfer rate $F_s 2F_d$ representing a sequence of instantaneous values of said signal waveform;
   transition detection means coupled to said input means for assembling an adjacent pair of said digital sample signals ($S_i$, $S_{i-1}$) and creating a detection flag $DF_i$ responsive to a sign difference between said adjacent pair of digital sample signals ($S_i$, $S_{i-1}$);
   decimation means coupled to said transition detection means for reducing said transfer rate $F_s$ of said digital sample signals from $2F_d$ to said data clock rate $R_d$; and
   time generator means coupled to said decimation means for interpolating said threshold transition time t within an interval $T_d$ equal to the reciprocal of said data clock rate $F_d$ and for creating a digital signal representative of the ratio $t/T_d$ of said threshold transition time t to said interval $T_d$.

29. The ADTD of claim 28 wherein said input means further comprises:
   means for accepting a pulse qualification flag representing that said threshold transition results from a signal pulse rather than a noise pulse.

30. The ADTD of claim 29 wherein said transition detection means comprises:
   first register means for storing the earlier said digital sample signal $S_{i-1}$ of said adjacent pair of digital sample signals ($S_i$, $S_{i-1}$);
   second register means for storing the later said digital sample signal $S_i$ of said adjacent pair of digital sample signals ($S_i$, $S_{i-1}$);
   sign comparator means for creating a signal corresponding to the logical exclusive-or of the signs of said adjacent pair of digital sample signals ($S_i$, $S_{i-1}$); and
   detection qualification means for enabling the output from said sign comparator means responsive to both said pulse qualification flags corresponding to said adjacent pair of digital sample signals ($S_i$, $S_{i-1}$).

31. The ADTD of claim 30 wherein said decimation means comprises:
   third register means for storing said adjacent pair of digital sample signals ($S_i$, $S_{i-1}$);
   selection means for selecting within one said interval $T_d$ either a first said adjacent pair of digital sample signals ($S_i$, $S_{i-1}$) or a second said adjacent pair of digital sample signals ($S_{1+1}$, $S_i$);
   MSB means for identifying which of said first or second adjacent pairs of digital sample signals ($S_i$, $S_{i-1}$) is selected by said selection means; and
   dual clocking means for stepping the input of said decimation means at said transfer rate $F_s 2F_d$ and for stepping the output of said decimation means at said data rate $F_d$.

32. The ADTD of claim 31 wherein said time generator means comprises:
   reciprocal map means for creating a reciprocal digital signal $|S_{i-1}S_i|^{-1}$ representing the reciprocal of the absolute value of the difference between said adjacent pair of digital sample signals ($S_i$, $S_{i-1}$); and
   multiplier means for multiplying said reciprocal digital signal $|S_{i-1}-S_i|^{-1}$ by the absolute value of said earlier digital sample signal $|S_{i-1}|$ to obtain said digital signal representing the ratio $t/T_d = |S_{i-1}| \cdot |S_{i-1}-S_i|^{-1}$ of said threshold transition time t to said interval $T_d$.

33. The ADTD of claim 28 wherein said transition detection means comprises:
   first register means for storing the earlier said digital sample signal $S_{i-1}$ of said adjacent pair of digital sample signals ($S_i$, $S_{i-1}$);
   second register means for storing the later said digital sample signal $S_i$ of said adjacent pair of digital sample signals ($S_i$, $S_{i-1}$);
   sign comparator means for creating a signal corresponding to the logical exclusive-or of the signs of said adjacent pair of digital sample signals ($S_i$, $S_{i-1}$); and
   detection qualification means for enabling the output from said sign comparator means responsive to both said pulse qualification flags corresponding to said adjacent pair of digital sample signals ($S_i$, $S_{i-1}$).

34. The ADTD of claim 28 wherein said decimation means comprises:
   third register means for storing said adjacent pair of digital sample signals ($S_i$, $S_{i-1}$);
   selection means for selecting within one said interval $T_d$ either a first said adjacent pair of digital sample signals ($S_i$, $S_{i-1}$) or a second said adjacent pair of digital sample signals ($S_{1+1}$, $S_i$);

MSB means for identifying which of said first or second adjacent pairs of digital sample signals ($S_i$, $S_{i-1}$) is selected by said selection means; and dual clocking means for stepping the input of said decimation means at said transfer rate $F_s 2F_d$ and for stepping the output of said decimation means at said data rate $F_d$.

35. The ADTD of claim 28 wherein said time generator means comprises:

reciprocal map means for creating a reciprocal digital signal $|S_{i-1}S_i|^{-1}$ representing the reciprocal of the absolute value of the difference between said adjacent pair of digital sample signals ($S_i$, $S_{i-1}$); and multiplier means for multiplying said reciprocal digital signal $|S_{i-1}-S_i|^{-1}$ by the absolute value of said earlier digital sample signal $|S_{i-1}|$ to obtain said digital signal representing the ratio $t/T_d = |S_{i-1}| \cdot |S_{i-1}-S_i|^{-1}$ of said threshold transition time t to said interval $T_d$.

* * * * *

UNITED STATES PATENT AND TRADEMARK OFFICE
CERTIFICATE OF CORRECTION

PATENT NO. : 5,315,284
DATED : May 24, 1994
INVENTOR(S) : Bentley et al

It is certified that error appears in the above-indentified patent and that said Letters Patent is hereby corrected as shown below:

In the following NINE (9) instances, please change "$F_s 2F_d$" to --$F_s=2F_d$--

Claim 7, col. 8, line 59
Claim 10, col. 9, line 36
Claim 15, col.10, line 48
Claim 18, col. 11, line 26
Claim 23, col. 12, line 38
Claim 26, col. 13, line 16
Claim 28, col. 13, line 42
Claim 31, col. 14, line 28
Claim 34, col. 15, line 5

Signed and Sealed this

Thirtieth Day of August, 1994

Attest:

BRUCE LEHMAN

Attesting Officer

Commissioner of Patents and Trademarks